United States Patent
Elmegreen et al.

(10) Patent No.: US 9,058,868 B2
(45) Date of Patent: Jun. 16, 2015

(54) PIEZOELECTRONIC MEMORY

(71) Applicant: International Business Machines Corporation, Armonk, NY (US)

(72) Inventors: Bruce G. Elmegreen, Goldens Bridge, NY (US); Glenn J. Martyna, Croton on Hudson, NY (US); Dennis M. Newns, Yorktown Heights, NY (US); Paul M. Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 412 days.

(21) Appl. No.: 13/719,965

(22) Filed: Dec. 19, 2012

(65) Prior Publication Data

US 2014/0169078 A1    Jun. 19, 2014

(51) Int. Cl.
    G11C 11/00    (2006.01)
    G11C 13/00    (2006.01)
    G11C 11/22    (2006.01)
    H01L 49/00    (2006.01)

(52) U.S. Cl.
    CPC ............ *G11C 13/0002* (2013.01); *G11C 11/22* (2013.01); *H01L 49/00* (2013.01)

(58) Field of Classification Search
    USPC .................................................. 365/157, 174
    See application file for complete search history.

(56) References Cited

U.S. PATENT DOCUMENTS

| | | | |
|---|---|---|---|
| 2,782,397 A | 2/1957 | Young | |
| 3,138,726 A | 6/1964 | Samuelson | |
| 4,419,598 A | 12/1983 | Spitz et al. | |
| 4,589,009 A | 5/1986 | Motamedi | |
| 5,060,191 A | 10/1991 | Nagasaki et al. | |
| 5,231,326 A | 7/1993 | Echols | |
| 5,673,220 A | 9/1997 | Gendlin | |
| 5,760,675 A | 6/1998 | Lee et al. | |
| 5,796,298 A * | 8/1998 | Kearney et al. | 327/561 |
| 5,872,372 A | 2/1999 | Lee et al. | |
| 5,883,419 A | 3/1999 | Lee et al. | |
| 5,938,612 A | 8/1999 | Kline-Schoder et al. | |
| 6,083,762 A | 7/2000 | Papen et al. | |
| 6,392,934 B1 | 5/2002 | Saluel et al. | |
| 6,548,942 B1 | 4/2003 | Panasik | |
| 7,208,786 B2 | 4/2007 | Chu | |
| 7,709,317 B2 | 5/2010 | Yang et al. | |
| 7,848,135 B2 | 12/2010 | Elmegreen et al. | |
| 7,968,945 B2 | 6/2011 | Lolivier et al. | |
| 7,973,350 B2 | 7/2011 | Collonge et al. | |
| 7,999,440 B2 | 8/2011 | Miller et al. | |

(Continued)

OTHER PUBLICATIONS

Bruce G. Elmegreen, et al., "Non-Volatile, Piezoelectronic Memory Based on Piezoresistive Strain Produced by Piezoelectronic Remanence," U.S. Appl. No. 14/222,813, filed Mar. 24, 2014.

(Continued)

*Primary Examiner* — Vu Le

(74) *Attorney, Agent, or Firm* — Cantor Colburn LLP; Vazken Alexanian

(57) ABSTRACT

A memory element includes a first piezotronic transistor coupled to a second piezotronic transistor; the first and second piezotronic transistors each comprising a piezoelectric (PE) material and a piezoresistive (PR) material, wherein an electrical resistance of the PR material is dependent upon an applied voltage across the PE material by way of an applied pressure to the PR material by the PE material.

25 Claims, 12 Drawing Sheets

(56) References Cited

U.S. PATENT DOCUMENTS

| | | | |
|---|---|---|---|
| 8,003,427 | B2 | 8/2011 | Faraone et al. |
| 8,004,154 | B2 | 8/2011 | Cueff et al. |
| 8,125,121 | B2 | 2/2012 | Honda |
| 8,159,854 | B2 | 4/2012 | Elmegreen et al. |
| 8,247,947 | B2 | 8/2012 | Elmegreen et al. |
| 8,405,279 | B2 | 3/2013 | Elmegreen et al. |
| 8,552,621 | B2 | 10/2013 | Piazza et al. |
| 8,598,039 | B2 | 12/2013 | Wang et al. |
| 8,604,670 | B2 | 12/2013 | Mahameed et al. |
| 2006/0054926 | A1 | 3/2006 | Lahreche |
| 2007/0235784 | A1 | 10/2007 | Krusin-Elbaum et al. |
| 2008/0289417 | A1 | 11/2008 | Okada |
| 2009/0026890 | A1 | 1/2009 | Goat et al. |
| 2010/0073997 | A1 | 3/2010 | Elmegreen et al. |
| 2010/0328984 | A1 | 12/2010 | Elmegreen et al. |
| 2011/0133603 | A1 | 6/2011 | Elmegreen et al. |
| 2012/0135590 | A1 | 5/2012 | Hendrix et al. |
| 2013/0009668 | A1 | 1/2013 | Elmegreen et al. |
| 2013/0020908 | A1 | 1/2013 | Pott et al. |
| 2013/0036827 | A1 | 2/2013 | Besling |
| 2013/0043767 | A1 | 2/2013 | Yamamoto et al. |
| 2014/0169078 | A1 | 6/2014 | Elmegreen et al. |

OTHER PUBLICATIONS

Bruce G. Elmegreen, et al., "Piezoelectronic Devices with Novel Force Amplification" U.S. Appl. No. 61/950,343, filed Mar. 10, 2014.
B.S. Kang et al; "Pressure-induced changes in the conductivity of AlGaN/GaN high-electron mobility-transistor membranes," Applied Physics Letters, vol. 85, No. 14, Oct. 4, 2004; pp. 2962-2964.
F.F.C. Duval et al.; "High Frequency PZT Composite Thick Film Resonators;" Integrated Ferroelectrics, 63, 2004; pp. 27-33.
C.J. Glassbrenner et al.; "Thermal Conductivity of Silicon and Germanium from 3K to the Melting Point*," Physical Review, vol. 134, No. 4A, May 18, 1964, pp. A1058-A1069.
A. Husmann et al.; "Dynamical Signature of the Mott-Hubbard Transition in Ni(S,Se)2," Science, vol. 274; Dec. 13, 1996; pp. 1874-1876.
A. Jayaraman et al.; "Continuous and Discontinuous Semiconductor-Metal Transition in Samarium Monochalcogenides Under Pressure;" Physical Review Letters, vol. 25, No. 20; Nov. 16, 1970; pp. 1430-1433.
Jon Maimon et al.; "Chalcogenide-Based Non-Volatile Memory Technology;" IEEE Aerospace Conf. Proceedings, 2001, pp. 2289-2294.
G. Krill et al.; "Physical Properties of Compounds NiS2-xSex with Pyrite Structure: Metal-Non Metal Transition, Evidence of the Existence of an Antiferromaagnetic Metallic Phase;" Journal de Physique, vol. 10, No. 37; Oct. 1976; pp. C4-23-C427.
R. Lengsdorf et al.; "The observation of the insulator-metal transition in EuNio3 under high pressure;" Journal of Physics: Condensed Matter, 16; 2004; pp. 3355-3360.
C. Liu et al.; "Pressure-induced insulator-conductor transition in a photoconducting organic liquid-crystal film;" Letter to Nature, vol. 418; Jul. 11, 2002; pp. 162-164.
Maxim Lebedev et al.; "Effect of Thickness on the Piezoelectric Properties of Lead Zirconate Titanate Films Fabricated by Aerosol Deposition Method;" Jpn. J. Appl. Phys. vol. 41, 2002, pp. 6669-6673.
D.M. Newns, B.G. Elmegreen, X.-H. Liu, G. Martyna 2012, "A Low-Voltage High-Speed Electronic Switch Based on Piezoelectric Transduction," J. Appl. Phys.,111, 084509, 2012, pp. 1-18.
D. M. Newns et al., "4-Terminal Piezoelectronic Transistor (PET)," U.S. Appl. No. 13/176,880, filed Jul. 6, 2011.
Stefan Lai et al.; "OUM—A 180 nm Nonvolatile Memory Cell Element Technology for Stand Alone and Embedded Applications;" IEEE, IEDM Tech Digest, 2001, pp. 803-806.
D.M. Newns, B.G. Elmegreen, X.-H. Liu, G. Martyna, "High Response Piezoelectric and Piezoresistive Materials for Fast, Low Voltage Switching : Simulation and Theory of Novel Transduction Physics at the Nanoscale" Advanced Materials, 2012, pp. 1-7.
Ju. H. Krieger, "Acousto-Ferroelectric RAM-New Type of Nonvolatile Memory Device," IEEE, pp. 53-55, 2007.
Hidekuni Takao et al., "Stress-Sensitive Differential Amplifiers Using Piezoresistive Effects of MOSFETs and Their Application to Three-Axial Accelerometers," Elsevier, Sensors and Actuators-A Physical; 65; pp. 61-68; 1998.
Young-Tae Kim et al.; "Study on Cell Characteristics of PRAM Using the Phase-Change Simulation;" IEEE, 2003, pp. 211-214.
S. Sriram et al.; "Measurement of high piezoelectric response of strontium-doped lead zirconate titanate thin films using a nanoindenter;" Journal of Applied Physics 101, 104910 (2007), pp. 101-105.
Arturas Ulcinas et al.; "Investigation of microstructure and piezoelectric properties of Zr- and Sm- doped PbTiO3 nanostructured thin films derived by sol-gel technology;" Sensors and Actuators B 109, 2005, pp. 97-101.
S.S. Lu et al.; "Piezoelectric field effect transistor (PEFET) using In0.2Ga0.8As/Al0.35/In0.2Ga0.8As/GaAS strained layer structure on (111)B GaAs substrate;" Electronic Letters May 12, 1994 vol. 30 No. 10; pp. 823-825.
Scott Tyson et al.; "Nonvolatile, High Density, High Performance Phase Change Memory;" IEEE Aerospace Conf. Proceedings, 2001, pp. 385-390.
A. Jayaraman et al.; "Continuous and Discontinous Semiconductor-Metal Transition in Samarium Monochalcogenides Under Pressure;" Physical Review Letters, vol. 25, No. 20, Nov. 16, 1970; pp. 1430-1433.
Sharath Sriram et al.; ARNAM 2007 Annual Workshop Abstract Only, 2007.
S. Sriram et al.; "The effect of post-deposition cooling rate on the orientation of piezoelectric (Pb0.92Sr0.08) (Zr0.65Ti0.35)O3 thin films deposited by RF magnetron sputtering;" Semiconductor Science and Technology 21; 2006; pp. 1236-1243.
S. Tomic et al.; "Pressure-Induced Metal-to-Insulator Phase Transitions in the Organic Conductor (2,5 DM-DCNQI) 2Cu;" Europhysics Letters, 5 (6); Mar. 15, 1988; pp. 553-558.
X. Wang et al.; "Piezoelectric Field Effect Transistor and Nanoforce Sensor Based on a Single ZnO Nanowire;" Nano Letters 2006 vol. 6, No. 12; pp. 2768-2772.
F. Xu et al.; "Longitudinal piezoelectric coefficient measurement for bulk ceramics and thin films using pneumatic pressure rig;" Journal of Applied Physics vol. 86, No. 1, Jul. 1, 1999; pp. 588-594.
Y. Yamashita et al.; "Can relaxor piezoelectric materials outperform PZT?(Review);" IEEE; 1996; 71-78.
A. Yukikuni et al.; "Pressure induced insulator-methal transition in hexagonal BaTiO3;" Journal of Physical Society of Japan; 2004; Abstract.
A. Jayaraman, "Pressure-volume relationship and pressure-induced electronic and structural transformations in Eu and Yb monochalcogenides," Physical Review B, vol. 9, No. 6, Mar. 15, 1974, pp. 2513-2520.
A. Jayaraman, et al., "Study of the Valence Transition in Eu-, Yb-, and Ca-substituted SmS under High Pressure and some Comments on other Substitutions," Physical Review B, vol. 19, No. 8, Apr. 15, 1979, pp. 1-8.
Bruce G. Elmegreen, et al. "Piezoelectronic Device With Novel Force Amplification " U.S. Appl. No. 14/577,279, filed Dec. 19, 2014.
Brian A. Bryce, et al., "Integrating a Piezoresistive Element in a Piezoelectronic Transistor" U.S. Appl. No. 14/529,886, filed Oct. 31, 2014.
Brian A. Bryce, et al., "Passivation and Alignment of Piezoelectronic Transistor Piezoresistor" U.S. Appl. No. 14/529,929, filed Oct. 31, 2014.
Brian A. Bryce, et al., "Piezoelectronic Transistor With Co-Planar Common and Gate Electrodes" U.S. Appl. No. 14/529,834, filed Oct. 31, 2014.
Bruce G. Elmegreen, et al., "Low Voltage Transistor and Logic Devices With Multiple, Stacked Piezoelectric Layers" U.S. Appl. No. 14/468,822, filed Aug. 26, 2014.
D. Xue, et al., "Elastic, piezoelectric, and dielectric properties of Ba(Zr0.2Ti0.8)O3-50(Ba0.7Ca0.3)TiO3 Pb-free ceramic at the morphotropic phase boundary," Journal of Applied Physics, 109, 054110, 2011, pp. 1-7.

(56) References Cited

OTHER PUBLICATIONS

D.C. Gupta, et al., "Pressure induced magnetic, electronic and mechanical properties of SmX (X=Se, Te)," Journal of Physics: Condensed Matter, 21, 2009, 436011, pp. 1-11.
G. M. M Rebeiz, "RF Mems Switches: Status of the Technology," Transducers, The 12th International Conference on Solid State Sensors, Actuators and Microsystes, Jun. 8-12, 2003, pp. 1726-1729.
Hu Cao, et al., "Elastic, Piezoelectric, and Dielectric Properties of 0.58Pb(Mg1/3Nb2/3) O3-0.42PbTiO3 Singel Crystal," Journal of Applied Physics, vol. 96, No. 1, Jul. 1, 2004, pp. 1-6.
Hu et al., "Converse Piezoelectric Effect Induced Transverse Deflection of a Free-Standing ZnO Microbelt", NANO Letters, vol. 9, No. 7, 2009, pp. 2661-2665.
J. Park, et al "Direct Observation of Nanoparticle Superlattice Formation by Using Liquid Cell Transmission Electron Microscopy," ACS Nano, vol. 6, No. 3, Feb. 2012, pp. 2078-2085.
Matthew W. Copel, et al., "Piezoelectronic Switch Device for RF Applications" U.S. Appl. No. 14/529,380, filed Oct. 31, 2014.
Xu et al., "Dielectric hysteresis from transverse electric fields in lead zirconate titanate thin films", Applied Physics Letters, vol. 74, No. 23, Jun. 7, 1999, pp. 3549-3551.
P.M. Solomon, et al., "The PiezoElectronic Switch: a Path to Low Energy Electronics," IEEE, 2013, pp. 1-2.
Sharath Sriram et al.; ARNAM 2007 Annual Workshop, "Measurement of High Piezoelectric response of strontium-doped lead zirconate titanate thin films using a nano-indenter," Abstract, 2007, pp. 1-1.
Samal et al., "Low-temperature (=200° C) plasma enhanced atomic layer deposition of dense titanium nitride thin films ", Journal of Vacuum Science & Technology A, vol. 31, No. 1, 2013, pp. 1-8.
R. Polcawich, et al., "Surface Micromachined Microelectromechanical Ohmic Series Switch Using Thin-Film Piezoelectric Actuators," IEEE Transactions on Microwave Theory and Techniques, vol. 55, No. 12, Dec. 2007, pp. 2642-2654.
S.J. Gross, "Micromachined Switches and Cantilever Actuators Based on Piezoelectric Lead Zirconate Titanate (PZT)," A Thesis in Electrical Engineering, PhD Dissertation, The Pennsylvania State University, Aug. 2004, pp. 1-156.
Y. Matsumuro, Y. Oishi, W.B. Wu, and M. Okuyama, "Preparation of PMN-PT Files by Laser Ablation Method," Integrated Ferroelectrics, 20, 1998, pp. 95-105.
D. Balma, et al., "High Piezoelectric Longitudinal Coefficients in Sol-gel PZT Thin Film Multilayers," Jornal of the American Ceramic Society, 2013, pp. 1-31.
J. C. Crawford, "A Ferroelectric-Piezoelectric Random Access Memory," IEEE Transactions on Electron Devices, vol. 18, No. 10, 1971, pp. 951-958.
HC Materials, [online]; [retrieved on Mar. 14, 2013]; retrieved from the Internet http://www.hcmat.com/Pmn_Properties.html HCMat, H.C. Materials Corporation, "Properties of Piezoelectric PMN-PT Crystal," 2004, pp. 1-4.
J. Li, et al., "Ultrafast polarization switching in thin-film ferroelectrics," Applied Physics Letters, 84, No. 7, 2004, p. 1174-1176.
I. Mayergotz, et al. "Hysteresis in Piezoelectric and Ferroelectric Materials," The Science of Hysteresis, vol. 3, Only Chapter 4, 2005, pp. 1-129.
Morgan Advanced Materials, [online]; [retrieved on Oct. 23, 2013]; retrieved from the Internet http://www.morganelectroceramics.com/materials/piezoelectric/single-crystal-piezo/ Morgan Technical Ceramics Electroceramics, "Single Crystal Piezo," Advanced Piezoelectric Materials, 2009, pp. 1-2.
F. Nakamura, et al., "From Mott Insulator to Ferromagnetic Metal: A pressure Study of CA2RuO4," Phys Rev B , vol. 65, No. 22, Article 220402, 2002, pp. 1-4.
R. Yu et al., "GaN Nanobelts Based Strain-Gated Piezotronic Logic Devices and Computation," ACS Nano, Publication Date (Web): Jun. 18, 2013, pp. 1-7.
T. Theis and P. Solomon, "In quest of the •Next Switch: Prospects for greatly reduced power dissipation in a successor to the silicon field-effect transistor," Proceedings of the IEEE, vol. 98, No. 12, pp. 2005-2014, Dec. 2010.

* cited by examiner

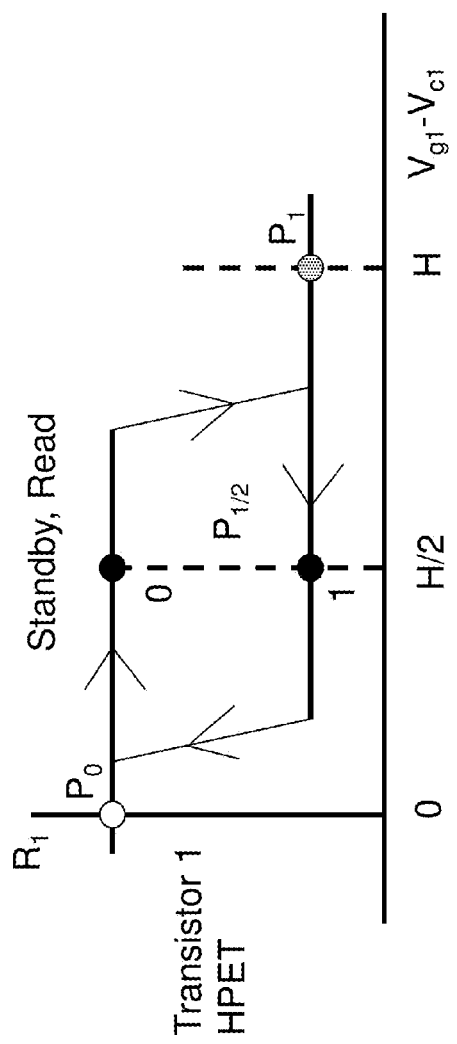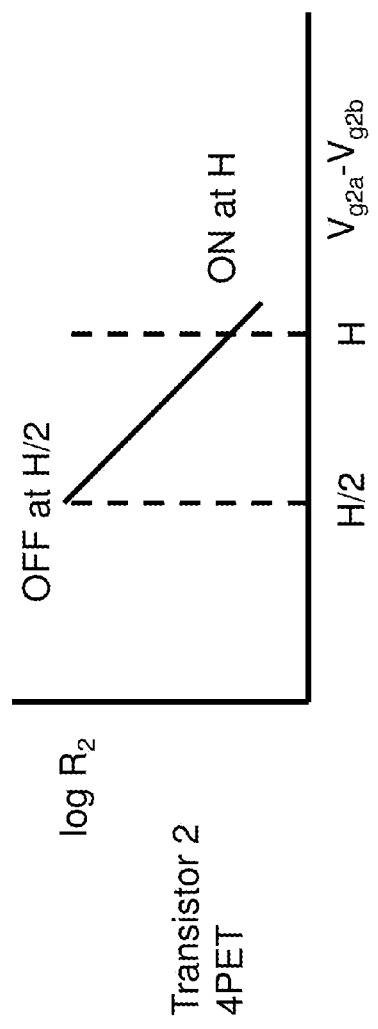

| | w | b |
|---|---|---|
| Write 0 | H | H |
| Write 1 | H | 0 |
| No Write | H/2 | H or 0 |
| Read | H | H/2 |
| Standby | H/2 | 0 |

Figure 6

|  | w | b |
|---|---|---|
| Write 0 | H | H/2 |
| Write 1 | H | -H/2 |
| No Write | 0 | -H/2 or H/2 |
| Read | H | εH/2 |
| Standby | 0 | 0 |

Figure 9

| | w | $b_1$ | $b_2$ |
|---|---|---|---|
| write 0 | H | 0 | -H/2 |
| write 1 | H | -H/2 | 0 |
| no write row | 0 | -H/2 or 0 | -H/2 or 0 |
| read row | H | εH/2 | 0 |
| no read row | 0 | " | " |
| stdby | 0 | 0 | 0 |

Figure 14

PIEZOELECTRONIC MEMORY

STATEMENT OF GOVERNMENT INTEREST

This invention was made with Government support under Contract No.: N66001-11-C-4109 awarded by Defense Advanced Research Projects Agency (DARPA). The Government has certain rights in this invention.

BACKGROUND

The present invention relates generally to integrated circuit devices and, more particularly, to piezoelectronic memory devices having piezoelectronic transistor components.

Field Effect Transistors (FETs) support the standard computer architecture (CMOS) currently used in logic and memory. Their shrinking size over several decades, following Moore's law, led to enormous increases in speed and reductions in voltage, as predicted by Dennard scaling theory. However, starting around 2003, supply voltages could no longer be reduced, and that meant clock speeds had to be limited to prevent excessive power densities. Discovery of a fast, low voltage switching device, based on a different principle of operation, has become critical for the continued pace of information technology.

One way in which the approach could be different would be to have the voltage that controls the switching device transduced into another energy state, such as pressure, which is gated and then transduced back into a voltage or current at the output. With mechanical amplification in the case of pressure transduction, it is possible to have a very small input voltage control a rather large output. The result is a switch for logic and memory that operates at an extremely low power density.

It is also desirable to find a technology that can build multi-layer structures that open up significant new applications, such as high capacity multilayer memories and combinations of logic and memory at different levels optimized to reduce wiring length. Such structures are very difficult to make in CMOS because of the need for all FETs to be formed in single crystal silicon. Technologies based on other materials may allow more three-dimensional structures.

SUMMARY

In an exemplary embodiment, a memory element includes a first piezotronic transistor coupled to a second piezotronic transistor; the first and second piezotronic transistors each comprising a piezoelectric (PE) material and a piezoresistive (PR) material, wherein an electrical resistance of the PR material is dependent upon an applied voltage across the PE material by way of an applied pressure to the PR material by the PE material.

In another embodiment, a piezotronic transistor device includes a first piezoelectric (PE) material disposed between a first electrode and a second electrode; a second PE material disposed between the first electrode and a third electrode; a piezoresistive (PR) material disposed between the second electrode and a fourth electrode, wherein an electrical resistance of the PR material is dependent upon an applied voltage across the first PE material by way of an applied pressure to the PR material by the first PE material; and a semi-rigid housing surrounding the PE, PR and electrode materials, the semi-rigid housing in direct physical contact with the first, third and fourth electrodes.

In another embodiment, piezotronic transistor device includes a piezoelectric (PE) material disposed between a first electrode and a second electrode, the PE material also disposed between the first electrode and a third electrode; a first piezoresistive (PR) material disposed between the second electrode and a fourth electrode, wherein an electrical resistance of the first PR material is dependent upon an applied voltage, via the first and second electrodes, across the first PE material by way of an applied pressure to the first PR material by the PE material; a second piezoresistive (PR) material disposed between the third electrode and a fifth electrode, wherein an electrical resistance of the second PR material is dependent upon an applied voltage, via the first and third electrodes, across the PE material by way of an applied pressure to the second PR material by the PE material; and a semi-rigid housing surrounding the PE, PR and electrode materials, the semi-rigid housing in direct physical contact with the first, fourth and fifth electrodes.

In another embodiment, a non-volatile memory element includes a first piezotronic transistor coupled to a second piezotronic transistor; the first and second piezotronic transistors each comprising at least one piezoelectric (PE) material and at least one piezoresistive (PR) material, wherein an electrical resistance of the at least one PR material is dependent upon an applied voltage across the at least one PE material by way of an applied pressure to the at least one PR material by the at least one PE material.

BRIEF DESCRIPTION OF THE SEVERAL VIEWS OF THE DRAWINGS

Referring to the exemplary drawings wherein like elements are numbered alike in the several Figures:

FIG. 3 is a resistance versus voltage curve for the device of FIGS. 1(a) and 1(b);

FIG. 4 is a resistance versus voltage curve for the device of FIGS. 2(a) and 2(b);

FIG. 6 is a table illustrating line voltage states for the 2-PET memory element of FIG. 5;

FIG. 9 is a table illustrating line voltage states for the 2-PET memory element of FIG. 8;

FIG. 14 is a table illustrating line voltage states for the 2-PET memory element of FIG. 13.

DETAILED DESCRIPTION

Figure 2A:
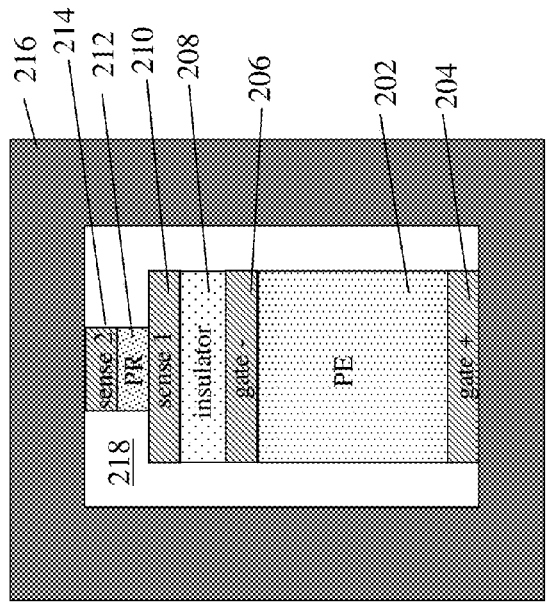
FIG. 2(a) is a schematic cross-sectional diagram of a 4-terminal, piezo-effect transistor (4PET)

Piezotronic memory (PEM) consists of a piezoelectric material (the "PE") in mechanical contact with a hysteric piezoresistive material (the "PR") that changes its resistivity upon compression and rarefaction. In operation, PE expansion followed by a return to the initial state compresses the hysteretic PR and causes it to change into a stable state with a low resistance. Conversely, PE contraction changes the PR into a stable state with a high resistance. PEM using hysteric phase change material has been proposed as a memory device in U.S. Pat. No. 7,848,135 to Elmegreen, et al. Additional detailed discussions of piezotronics, including materials for the PE and PR, and simulations of piezoelectronic transistors (PETs), logic inverters, ring oscillators, and flip-flops, may be found in D. M. Newns, B. G. Elmegreen, X.-H. Liu, G. Martyna 2012, "A Low-Voltage High-Speed Electronic Switch Based on Piezoelectric Transduction," J. Appl. Phys., 111, 084509, and in D. M. Newns, B. G. Elmegreen, X.-H. Liu, G. Martyna 2012, "High Response Piezoelectric and Piezoresistive Materials for Fast, Low Voltage Switching: Simulation and Theory of Novel Transduction Physics at the Nanoscale" Advanced Materials, 24, p. 3672-3677. Further patent related disclosures for other aspects of the PET may be found in U.S. Pat. No. 8,159,854 to Elmegreen, et al., U.S. Pat. No. 8,247,947 to Elmegreen, et al., and U.S. patent application Ser. No. 13/176,880.

Important aspects of memory cells for computers, cell phones, and other electronic devices are the maximum density of these cells on a single chip, the total memory capacity, the speed of reads and writes, the energy consumed in reads and writes, the energy consumed in preserving the memory state, and the long-term stability of the storage material. Accordingly, exemplary embodiment disclosed herein provide new designs for PEMs and PETs, as well as new designs for 2-control line and 3-control line PEMs that can be made entirely from piezoelectric and piezoresistive materials without the need for conventional FETs made with CMOS technology. The proposed PEM is fast, dense, and low power, and with certain designs that may be non-volatile as well. Furthermore, the read operation of such devices is non-destructive.

Broadly stated, a PET containing a hysteretic PR material (which has the property of bi-stability) is capable of being switched between two states, one of which has a low PR resistance, and the other of which has a relatively high PR resistance. The hysteretic PET (HPET) acts as the memory storage medium. A second PET serves as the access device (which turns on only in response to the word line), and when OFF protects the memory cell from bit line fluctuations. To minimize interface fracture or depolarization of the PR, the HPET PR is designed to operate under typical conditions at positive pressure. Its standby condition near the center of its hysteresis loop is then held by a continuous positive pressure.

The PE in the HPET operates in or close to unipolar mode for long term stability, meaning that it applies positive or zero pressure under a voltage which does not change sign. The standby mode has an intermediate pressure. One way to implement this, as illustrated in the first two embodiments described below, is to apply a positive bias voltage to the PE to achieve positive pressure during standby. Then, the PE operates with a smaller or larger positive voltage relative to the standby voltage during switching. Another solution, as implemented in a third embodiment, is to apply a positive bias pressure to the PE during standby using a surrounding material under tension, and then to write either by reducing the pressure on the PR by expanding the housing structure with one PE, or by increasing the pressure on the PR by expanding a second PE in contact with the PR.

A basic memory element described herein includes two PETs configured in a cross-point array, with one PET having a hysteric PR layer and the other having a non-hysteric PR layer. With the ability to fabricate several layers of this material, including intervening non-conductive layers with high yield strength, the footprint of each element in a memory array can be small, for example, one PET footprint with two PETs vertically stacked, plus the associated wiring. As described in the Newns, et al. publication mentioned above, Piezotronics has Dennard scaling.

Figure 1A:
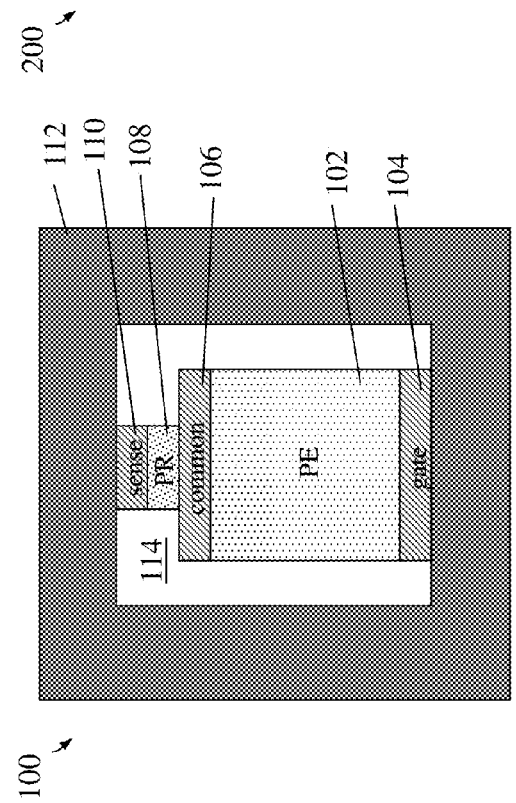
FIG. 1(a) is a schematic cross-sectional diagram of a 3-terminal, hysteretic piezo-effect transistor (HPET)
Figure 1B:
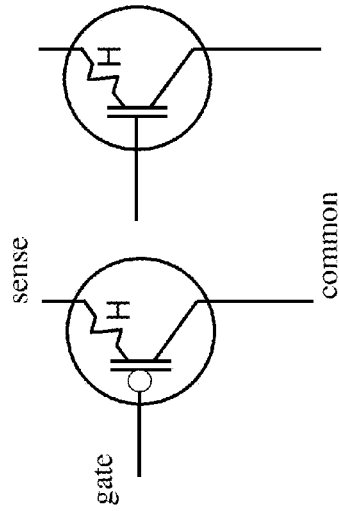
FIG. 1(b) illustrates electrical symbols for the HPET of FIG. 1(a)

Referring initially to FIGS. 1(a) and 1(b), there is shown a schematic cross-sectional diagram of a 3-terminal, hysteretic piezo-effect transistor (HPET) 100 in FIG. 1(a) and corresponding electrical symbols in FIG. 1(b). The 3-terminal HPET 100 includes a piezoelectric (PE) material 102 disposed between a gate electrode 104 and a common electrode 106, a piezoresistor (PR) material 108 disposed between the common electrode 106 and a sense electrode 110, and a semi-rigid high yield material (HYM) 112 serving as a housing that surrounds the materials and electrodes. A PE material is a material that may either expand or contract when an electric potential is applied across the piezoelectric material, while a PR material in the present context is a material that changes resistivity with applied mechanical stress so as to transition from an insulator to a conductor. A medium 114 between the HYM 112 and the various electrode, PE and PR materials may remain as a void, or be filled with a soft solid material or a gas (e.g., air).

In the diagram of FIG. 1(b) illustrating gate, common, and sense contacts of the HPET 100, the left symbol with the small circle at the gate electrode is used when the voltage of the gate is less than the voltage of the common. The right symbol is used when the gate voltage is greater than the common. Piezoelectrics are polled at fabrication for a fixed voltage direction during use.

In operation, an input voltage coupled to the gate electrode 104 and the common electrode 106 is applied across the PE material 102, which causes an expansion and displacement of the PE crystal material 102 that in turn acts on the PR material 108 via the HYM 112. That is, the induced pressure from the PE crystal material 102 causes an insulator-to-metal transition so that the PR material 108 provides a conducting path between the common electrode 106 and the sense electrode 110. The HYM 112 ensures that the PE crystal material displacement is transmitted to the PR material 108 rather than the surrounding medium 114.

An alternative to the 3-terminal HPET design is illustrated in FIG. 2(a), which depicts a schematic cross-sectional diagram of a 4-terminal, piezo-effect transistor (4PET) 200. As is the case for the HPET 100, the 4PET in FIG. 2(a) includes a PE crystal material 202. Here, however, instead of being disposed between a gate electrode and a common electrode, the PE material 202 is disposed between a first gate electrode 204 (also labeled "gate +") and a second gate electrode 206 (also labeled "gate −"). A low permittivity insulator layer 208 separates the second gate electrode 206 (gate −) from a first sense electrode 210 (also labeled "sense 1"). Effectively, the common electrode of the 3-terminal configuration is split into the "gate −" electrode 206 and the sense 1 electrode 210 for a 4-terminal configuration.

The insulator layer 208 separating the "gate −" and "sense 1" terminals may a relatively high Young's modulus, such as in the range of about 60 gigapascals (GPa) to about 250 GPa, for example, a relatively low dielectric constant (e.g., about 4-12), and a high breakdown field. Suitable insulator materials thus include, for example, silicon dioxide ($SiO_2$) or silicon nitride ($Si_3N_4$). As further depicted in FIG. 2(a), a PR material 212 is disposed between the first sense electrode 210 ("sense 1") and a second sense electrode 214 (also labeled "sense 2"). Similar to the 3-terminal HPET embodiment, the 4-terminal PET 200 includes a high yield strength material 216 such as silicon dioxide ($SiO_2$) or silicon nitride ($Si_3N_4$) which surrounds and encapsulates all of the components described above. Again, there is a gap or vacant space 218 between the various layers of the 4-terminal PET 200 and the high yield material 216, which increases the freedom of mechanical displacement of the layers.

The electrodes in the 4-terminal PET may include materials such as strontium ruthenium oxide ($SrRuO_3$ (SRO)), platinum (Pt), tungsten (W) or other suitable mechanically hard conducting materials. The PE 202 may include a relaxor piezoelectric such as PMN-PT (lead magnesium niobate-lead titanate) or PZN-PT (lead zinc niobate-lead titanate) or other PE materials typically made from perovskite titanates. Such PE materials have a large value of displacement/V $d_{33}$, e.g., $d_{33}$=2500 pm/V, support a relatively high piezoelectric strain (~1%), and have a relatively high endurance, making them ideal for the PET application. The PE 202 could also include another material such as PZT (lead zirconate titanate). The PR 212 is a material which undergoes an insulator-to-metal transition under a relatively low pressure in a range such as 0.4-3.0 GPa. Some examples of PR material include samarium selenide (SmSe), thulium telluride (TmTe), nickel disulfide/diselenide ($Ni(S_xSe_{1-x})_2$), vanadium oxide ($V_2O_3$) doped with a small percentage of Cr, calcium ruthenium oxide ($Ca_2RuO_4$), etc.

Figure 2B:
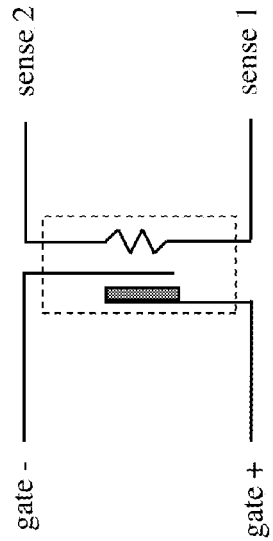
FIG. 2(b) is an electrical symbol for the 4PET of FIG. 2(a)

A circuit symbol for the 4-terminal PET is shown in FIG. 2(b), which schematically depicts a common contact being split into "gate −" and "sense 1" terminals by a low-permittivity insulator. The gate terminal is relabeled "gate +", and the sense terminal relabeled "sense 2".

In operation of the 4-terminal PET 200, an input voltage between "gate −" and "gate +" may be always positive or zero. When the input voltage is zero, the PE material 202 has no displacement and the PR material 212 is uncompressed, giving it a high electrical resistance such that the 4-terminal PET 200 is "off". When a significant positive voltage is applied between "gate −" and "gate +", the PE material 202 develops a positive strain. That is, the PE material 202 expands upwards along the axis perpendicular to the stack. The upward expansion of the PE material 202 tries to compress the high Young's modulus insulator 208, but the main effect is to compress the more compressible PR material 212. The compressive action is effective because the surrounding high yield strength material 216 strongly constrains the relative motion of the top of the "sense 2" electrode 214 and the bottom of the "gate +" electrode 204. The combined effect of the mechanical compression of the PR material 212 by the constrained stack and the PR material 212 piezoresistive response is to lower the "sense 1" electrode to "sense 2" electrode impedance by about 3-5 orders of magnitude under conditions where the input voltage is the designed line voltage VDD. The PET switch is now "on".

FIG. 3 is a resistance versus voltage curve for a 3-terminal HPET device 100 such as shown in FIGS. 1(a) and 1(b). As is illustrated, a relative high pressure (P1) as created by the gate-to-common ($V_{g1}$−$V_{c1}$) voltage, H (e.g., on the order of tenths of a volt, and more specifically from about 80 millivolts (mV) to about 200 mV), causes the PR material to assume a low resistance (logic 1), which low resistance remains even after the pressure is reduced to $P_{1/2}$ via the gate-to-common voltage being reduced to H/2. However, a relative low pressure (P0) as induced by a low voltage (below H/2) causes the PR material to assume a low resistance (logic 0), which remains even after the pressure increases to $P_{1/2}$ via the gate-to-common voltage being increased back to H/2. In contrast, FIG. 4 is a resistance versus voltage curve for the 4-terminal device of FIGS. 2(a) and 2(b). Here, the resistance versus voltage characteristics indicate a sharp transition from the high resistance off state at applied voltage ($V_{g2a}$−$V_{g2b}$) of H/2 to the low resistance on state at applied voltage H for this non-hysteretic material.

Figure 5:
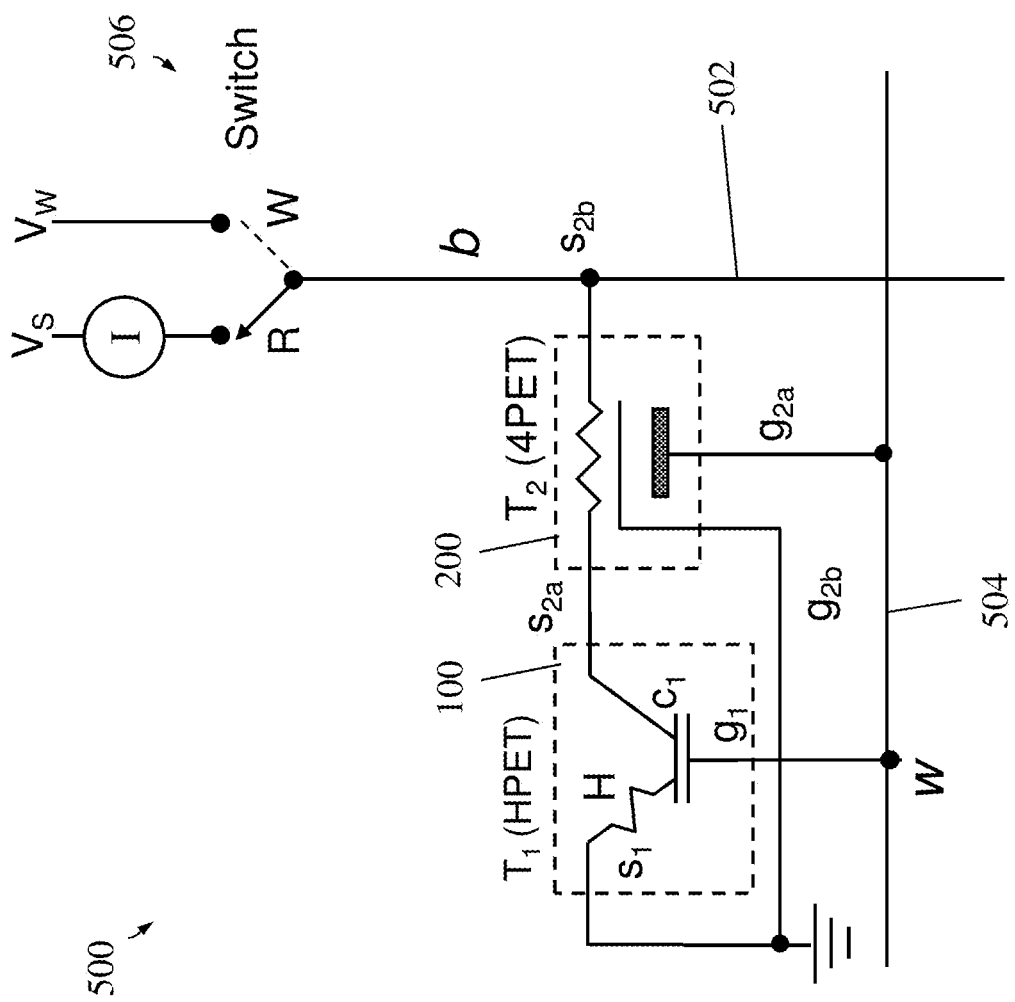
FIG. 5 is a schematic diagram of a two-PET (2-PET) memory element incorporating an HPET storage transistor and a 4PET access transistor, in accordance with an exemplary embodiment.

Referring now to FIG. 5, there is shown a schematic diagram of an individual, two-PET (2-PET) memory element 500 for an array incorporating a 3-terminal HPET storage transistor 100 (such as in FIG. 1) and a 4PET access transistor 200 (such as in FIG. 2), in accordance with an exemplary embodiment. The memory element 500 is coupled to a pair of control lines, b (bit line) 502 and w (word line) 504. The gate electrode ($g_1$) of the HPET storage transistor 100 is coupled to the word line 504, as is a first gate electrode ($g_{2a}$) of the 4PET access transistor 200. Both the sense electrode ($s_1$) of the HPET storage transistor 100 and a second gate electrode ($g_{2b}$) of the 4PET access transistor 200 are coupled to ground. The common electrode ($c_1$) of the HPET storage transistor 100 is coupled to a first sense electrode ($s_{2a}$) of the 4PET access transistor 200, while a second sense electrode ($s_{2b}$) of the 4PET access transistor 200 is coupled to the bit line 502. A switch 506 may be included in the peripheral logic to couple to separate read (sense) and write voltages ($V_s$, $V_w$) for the bit line b. The switch may also be implemented using a PET device in lieu of an FET device.

As summarized in the table of FIG. 6, the word line, w, is at a voltage of H/2 in a standby mode, and at voltage H in a Read/Write mode. The word line is also at voltage H/2 when a different word line in the array is being written ("No Write"). When the word line is at H/2 potential, the 4PET access transistor 200 is OFF, and when w is at H potential the access transistor is ON (FIG. 4). To implement a Write 0 operation (corresponding to establishing a high resistance in the HPET storage transistor 100), the word line, w, and the bit line, b, are both at potential H such that $V_{g1}$−$V_{c1}$=0. This places the HPET storage transistor 100 at P0 (FIG. 3) which then writes a 0 on return to Standby. To implement a Write 1 operation (corresponding to establishing a low resistance in the HPET storage transistor 100), the word line, w, is at potential H and the bit line, b, is at potential 0 (ground) such that $V_{g1}$−$V_{c1}$=H. This places the HPET storage transistor 100 at P1 (FIG. 3) which then writes a 1 on return to Standby. Finally, for a read operation, the cell is accessed by setting w=H and b=H/2 such that $V_{g1}$−$V_{c1}$=H/2 for the bit to remain stable during the read process (FIG. 3).

It should be noted that the common electrode voltage $V_{c1}$ is independent of the state of the HPET storage transistor 100 if the ON resistance for the 4PET access transistor 200 is significantly less than the ON resistance in the HPET storage transistor 100; i.e., $R_{2on} \ll R_{1on}$. Also, to avoid excessive leakage current during a write operation, the OFF resistance of the 4PET access transistor 200 should be significantly greater than the ON resistance in the HPET storage transistor 100; i.e., $R_{2off} \gg R_{1on}$. The dynamic range of R1 is assumed to be relatively small to enable these conditions.

In considering a memory array having N columns and M rows, M has to be smaller than $R_{2off}/R_{1on}$, as follows. The current to write a 0 in a single memory element is the voltage drop from b to ground, which is H, divided by the summed resistance of the 4PET access transistor 200 and the HPET storage transistor 100. The resistance of the on-state 4PET access transistor 200, $R_{2on}$, is much lower than the on-state resistance in the HPET storage transistor 100, $R_{1on}$; thus, the HPET storage transistor 100 in the memory element 500 dominates the total resistance regardless of its state. Therefore, the current through all N columns is 0.5 (N·H/$R_{1on}$) if half the memory cells in a row are in the low resistance (on) state. The leakage current through all of the other rows and all of the columns is 0.5 N(M−1)H/$R_{2off}$ for off resistance $R_{2off}$ in the 4PET access transistor 200. Again, this assumes half the memory elements are in the low resistance state, with $R_{1on} \ll R_{2off}$. The active write current dominates the leakage write current if $R_{2off}/R_{1on} > (M-1)$. This is the resistance constraint mentioned above.

During the read process, leakage current enters each bit line, b, from the rows that are not being read. These rows have resistance $R_{2off}$ in all of their 4PET access transistors 200. There is a voltage drop of H/2 across each combination of 4PET and HPET. If half of the HPETs in a no-read column are in the on state with resistance $R_{1on} \ll R_{2off}$, then the leakage current from the no-read rows in that column is 0.25(M−1)H/$R_{2off}$. This has to be smaller than the maximum current in that bit line from the read row, which is 0.5H/$R_{1on}$. Avoidance of contamination of the sense line by the non-read rows therefore requires $R_{2off}/R_{1on} \gg 0.5(M-1)$, which is the same as the condition for an efficient write, to within a factor of 2.

Figure 7A:
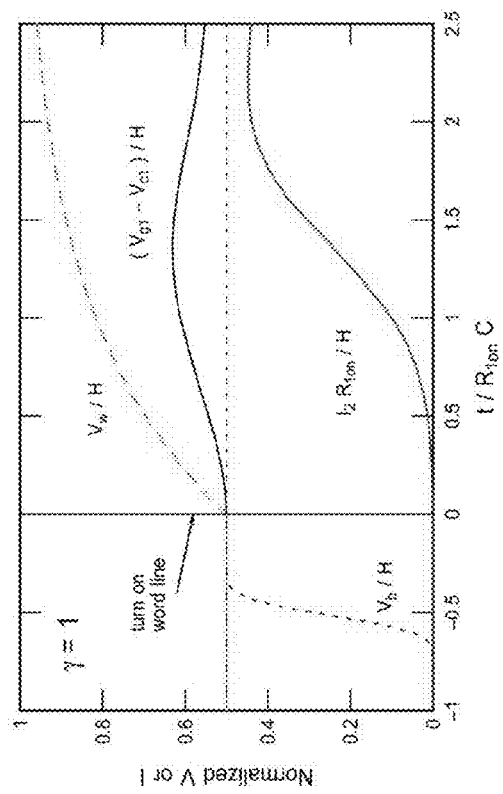
FIGS. 7(a) and 7(b) are graphs illustrating the time dependence of the gate-to-common voltage drop across the HPET and the current through the 4PET of the memory element of FIG. 5, following a switch from the standby to the read state.
Figure 7B:
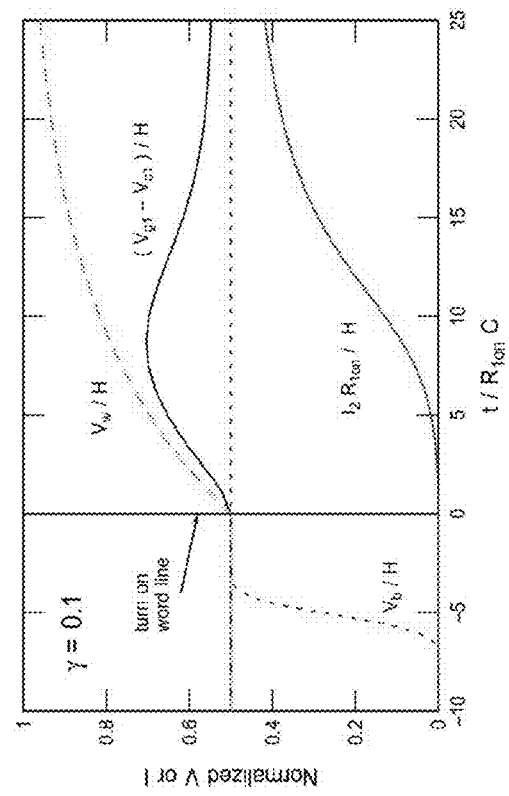

FIGS. 7(a) and 7(b) are graphs illustrating the time dependence of the gate-to-contact voltage drop ($V_{g1} - V_{c1}$) across the HPET storage transistor 100 and the current through the 4PET access transistor 200 of the memory element 500 of FIG. 5, following a switch from the standby state to the read state. This particular transition is important with respect to the stability of the stored bit, whereas the transition from Standby to Write is not critical since the bit will be destroyed anyway.

In any case, during the switch from Standby to Read, the bit line is assumed to change voltage from 0 to H/2 instantly at some time before the write line changes, and the write line is assumed to increase voltage with time from H/2 to H as $(H/2)(2-e^{-\gamma t})$ for rate $\gamma$. It will be noted that the bit line can change to H/2 one or more clock cycles before the word line voltage starts to increase, because as long as the word line is H/2, the 4PET access transistor 200 is off and the bit line voltage does not reach the HPET storage transistor 100. Specifically, FIG. 7(a) illustrates the case $\gamma = 1$ in units of the $R_{1on}C_1$ time constant where $C_1$ is the capacitance of the PE in the HPET storage transistor 100, and $R_{1on}$ is the on-state resistance in the HPET storage transistor 100. The x-axis is the quantity $t/(R_{1on}C)$, which ranges from −1 to 2.5, whereas the y-axis is both the normalized voltage drop $(V_{g1}-V_{c1})/H$, and the normalized current $I_2 R_{1on}/H$ in the 4PET access transistor 200. The resistance $R_2$ is assumed to swing 4 orders of magnitude, from $0.1 R_{1on}$ to $1000 R_{1on}$. In Read, this means that the read current through resistor $R_{1on}$ when the HPET storage transistor 100 has a logic value 1 is 1000 times the current through an unselected row (which has to pass through $R_{2off} = 1000 R_{1on}$), thereby allowing on the order of M=1000 rows compatible with the ability to see the read value 1 signal. Reading a value 0 (through resistor $R_{1off}$) is distinguished by a lower current. Similarly, in Write, the leakage current through the unselected rows is of the same order as the write current to the selected row in this case.

FIG. 7(b) illustrates for the case $\gamma = 0.1$. Both FIGS. 7(a) and 7(b) indicate that the time dependent swing of the voltage drop across the HPET storage transistor 100 is not large for the assumed parameters, in which case the state of the HPET resistance does not change during Read. Smaller values of $\gamma$ could cause a bit change; $\gamma > 0.1$ corresponds to an excursion in $(V_{g1}-V_{c1})/H$ that is less than 40%.

The memory cell 500 of FIG. 5 utilizes a constant voltage supply on the word line, w, with a value of either H or H/2. Leakage current through the piezoelectric, which is nominally a capacitor, should be minimized to avoid excessive energy dissipation. The leakage current through a PMN-PT piezoelectric with an electric field of $4 \times 10^6$ V/m equals $10^{-5}$ A/cm$^2$. This value is also expected for a design where the applied voltage is about 0.1 V and the PE thickness is about 25 nm. With a leakage current of $10^{-5}$ A/cm$^2$ for each PET, a memory with $10^9$ PETs, each with an area of $(30 \text{ nm})^2$, has a total leakage current of $10^{-7}$ A, or a total leakage power of $10^{-8}$ Watts. This is negligible compared to the other power dissipated.

Figure 8:
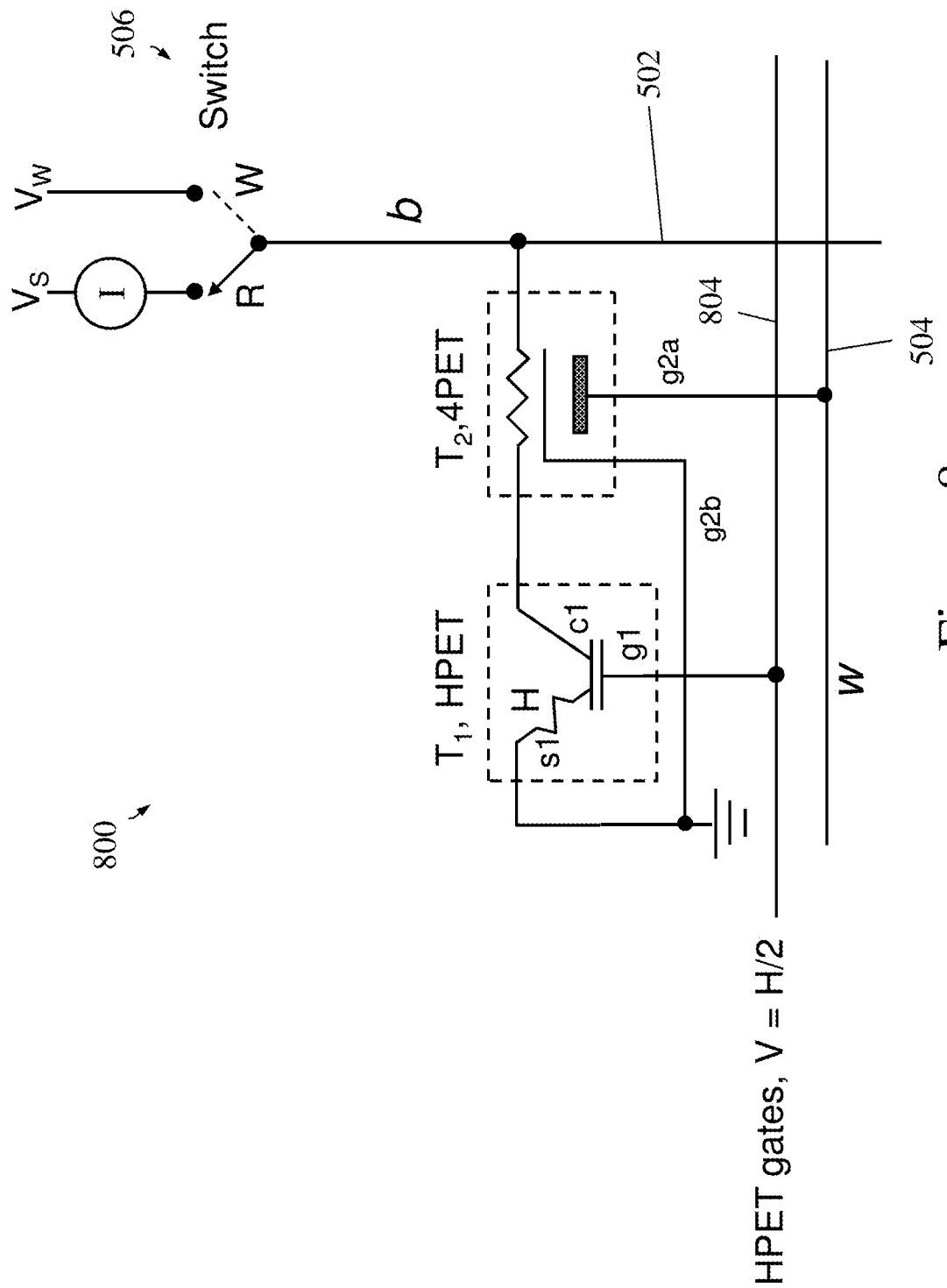
FIG. 8 is a schematic diagram of an alternative embodiment of the 2-PET memory element of FIG. 5, including separate control lines for the HPET and the 4PET.

Referring now to FIG. 8, there is shown a schematic diagram of an alternative embodiment of a 2-PET memory element 800. For ease of description, similar elements are designated with the same reference numerals. With respect to the memory element 500 of FIG. 5, the memory element 800 of FIG. 8 includes separate control lines for the HPET storage transistor 100 and the 4PET access transistor 200. Specifically, the word line 504 is coupled only to the 4PET access transistor 200. The gate electrode $g_1$ of the HPET storage transistor 100 is coupled to a separate control line 804, which is biased to a constant potential H/2.

Operation of the memory element 800 is understood with reference to the table in FIG. 9. In Standby, the word line 504 is set to w=0 to turn the 4PET access transistor 200 off. In Read/Write, the word line 504 is set to w=H to turn the 4PET access transistor 200 on. In the specific case of a Write, the word line 504 is set to w=H while the two PETs reach equilibrium. To write a 0, the bit line 502 is set to b=H/2, establishing $V_{g1}-V_{c1}=0$, and placing the HPET storage transistor 100 at P0 which then writes a 0 on return to Standby. To write a 1, the bit line 502 is set to b=−H/2, establishing $V_{g1}-V_{c1}=H$, and placing the HPET storage transistor 100 at P1 which then writes a 1 on return to Standby.

The steady voltage on the HPET gate as a result of the separate control line 804 removes the possibility that the $V_{g1}-V_{c1}$ write voltage and resulting current may swing into a damaging range (FIG. 7). In Read, the row is accessed by setting the word line 504 to w=H, and the HPET bit is preserved by setting the bit line 502 to b=∈H/2, which is a non-zero voltage that is much smaller than H/2; then $V_{g1}-V_{c1}=H/2(1-\in)$ for $\in \ll 1$. Again, the ON resistance of the 4PET access transistor 200 must be significantly less than the ON resistance in the HPET storage transistor 100, and the OFF resistance in the 4PET access transistor 200 must be significantly greater (order M) than the ON resistance in the HPET storage transistor 100.

The write current and leakage currents of the memory element 800 are the same as in the embodiment of FIG. 5. In addition, the constraint on leakage through the piezoelectric elements is also the same as in the embodiment of FIG. 5.

Figure 10A:
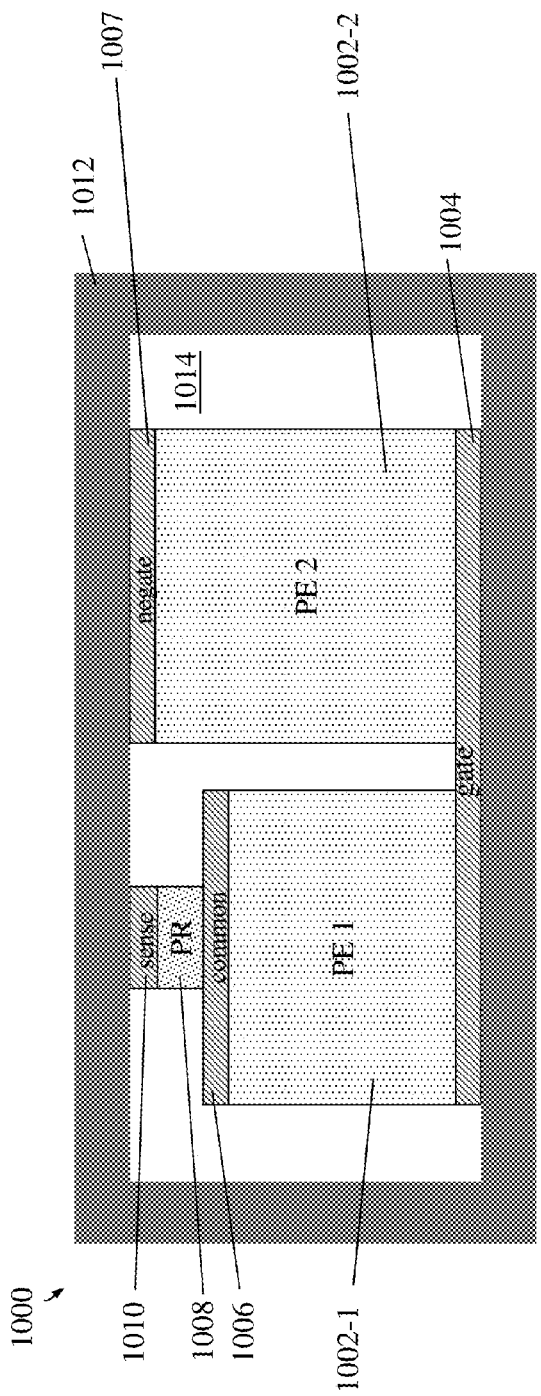
FIG. 10(a) is a schematic cross-sectional diagram of a dual polarity, piezo-effect transistor (PETDP), in accordance with another embodiment.

As indicated above, the embodiments described above are examples of volatile PET memory designs, in that the memory states are not preserved upon removal of voltage from the word and bit lines. Accordingly, FIG. 10(a) is a schematic cross-sectional diagram of a dual polarity, hysteretic piezo-effect transistor (HPETDP) 1000, in accordance with another embodiment. This dual polarity, 4-terminal PET design is useful for memory in which the voltage drop across the HPET has to be either positive or negative, with an equilibrium position in between.

Figure 10B:
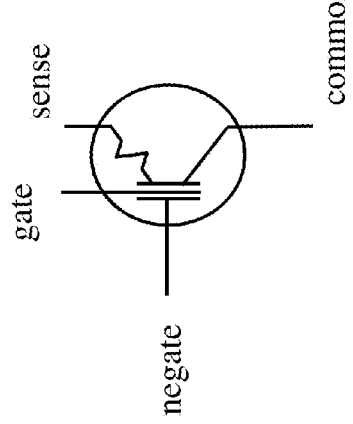
FIG. 10(b) is an electrical symbol for the PETDP of FIG. 10(a)

As shown in FIG. 10(*a*), the 4-terminal HPETDP 1000 includes a first PE material (PE 1) 1002-1 disposed between a gate electrode 1004 and a common electrode 1006. A second PE material (PE 2) 1002-2 is disposed between the gate electrode 1004 and a negate electrode 1007. In addition, a PR material 1008 is disposed between the common electrode 1006 and a sense electrode 1010, with an HYM 1012 serving as a strength medium surrounding the materials and electrodes. A medium 1014 between the HYM 1012 and the various electrode, PE and PR materials may remain as a void, or be filled with a soft solid material or a gas (e.g., air).

In this arrangement, the first piezoelectric (PE 1) is in direct force contact with the PR 1008, and the second piezoelectric (PE 2) is in force contact with the surrounding HYM 1012. When there is no voltage drop across either PE, the HYM 1012 and PE combination exert a static pressure on the PR 1008, causing the PR resistance to be in the bi-stable state. When there is a voltage drop across PE 1, from the gate to the common terminal, and the voltage drop across PE 2 is zero, PE 1 expands into the PR 1008 and causes the PR resistance to drop from the bi-stable state to the ON state (conducting, bit value 1). According to FIG. 3, a voltage drop across PE1 equal to H/2 is enough to cause this PR resistance drop because the equilibrium state is already bi-stable. On the other hand, a voltage drop of H/2 from the gate to the negate terminals across PE 2, combined with no voltage drop across PE 1, causes PE 2 to expand into the HYM walls and relieve the pressure on the PR 1008, leading to an increase in the PR resistance to the OFF state (bit value 0). In this manner, the HPETDP 1000 may switch between a high resistance state and a low resistance state compared to an equilibrium state of intermediate resistance. The HYM walls are slightly flexible and built to the pressure specification of the PR 1008 in the bi-stable state. FIG. 10(*b*) is an electrical symbol for the 4-terminal HPETDP of FIG. 10(*a*).

Figure 11:
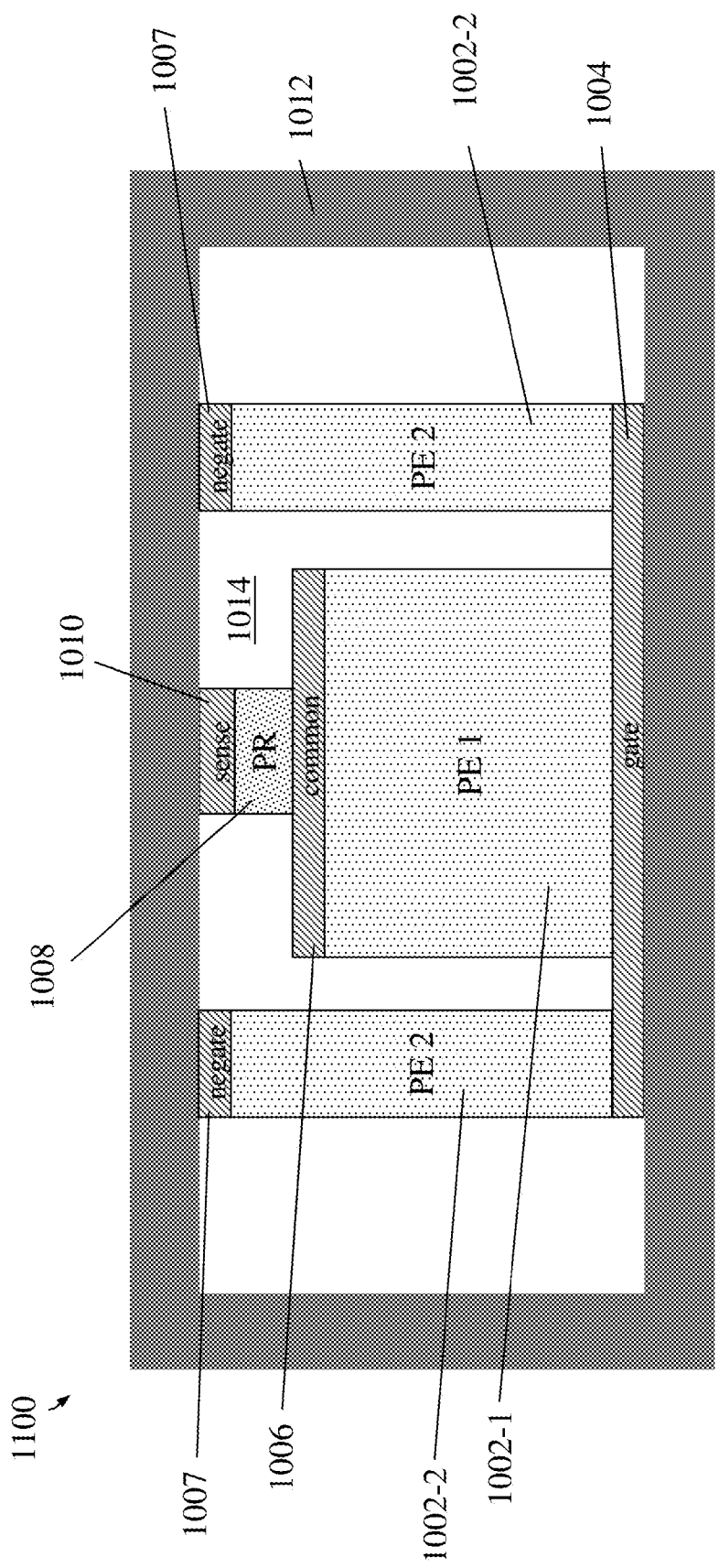
FIG. 11 is a schematic cross-sectional diagram of an alternative embodiment of the PETDP of FIG. 10(a)

In lieu of the "side by side" arrangement of the first and second PE materials of FIG. 10(*a*), FIG. 11 illustrates an alternative embodiment of a PETDP 1100. In this embodiment, the second piezoelectric (PE 2) 1002-2 and negate electrode 1007 are arranged as a ring-like structure that surrounds the first piezoelectric (PE 1) 1002-1, PR 1008, common electrode 1006 and sense electrode 1010. This structure exhibits a more uniform force on the HYM 1012 when the PE-2 material is caused to expand.

Figure 12A:
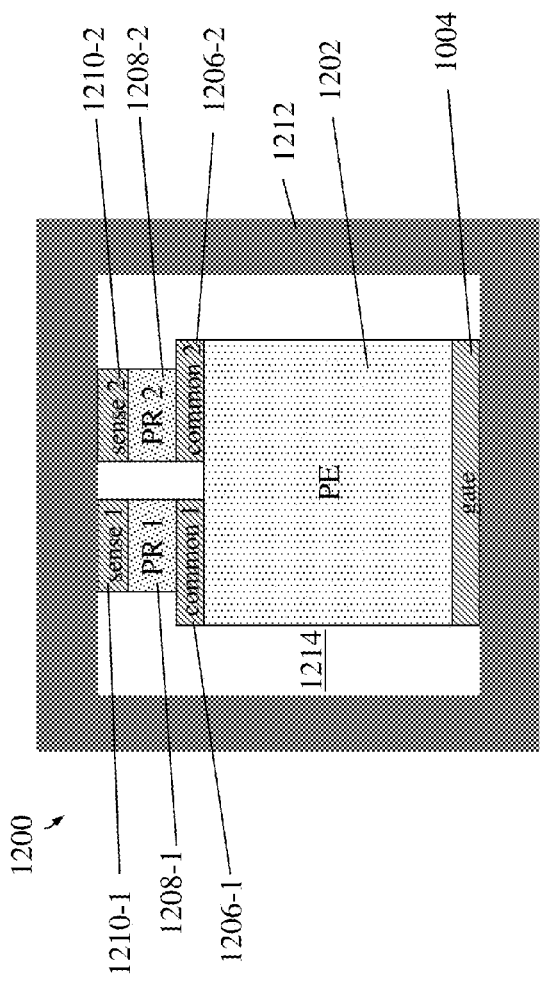
FIG. 12(a) is a schematic cross-sectional diagram of a dual resistance, piezo-effect transistor (PET2R), in accordance with another embodiment.
Figure 12B:
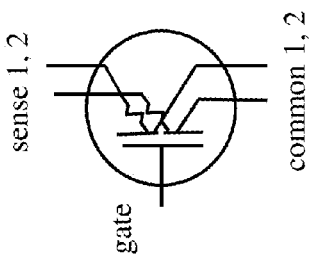
FIG. 12(b) is an electrical symbol for the PET2R of FIG. 12(a)

Referring now to FIG. 12(*a*), there is shown a schematic cross-sectional diagram of a dual resistance, piezo-effect transistor (PET2R) 1200, in accordance with another embodiment. The dual resistance PET2R 1200 is a 5-terminal device that includes a single PE and two PRs acting as separate resistors. The combination of a PE layer with two (or more) PR layers allows greater flexibility in circuit design, which may be contrasted with CMOS technology in which analogous devices in this regard are not possible.

As more specifically shown in FIG. 12(*a*), the 5-terminal PET2R 1200 includes a PE material 1202 disposed between a gate electrode 1204 and first and second common electrodes 1206-1, 1206-2 (also labeled "common 1" and "common 2"). A first PR material (PR 1) 1208-1 is disposed between the first common electrode 1206-1 and a first sense electrode (sense 1) 1210-1. Similarly, a second PR material (PR 2) 1208-2 is disposed between the second common electrode 1206-2 and a second sense electrode (sense 2) 1210-2. An HYM 1212 serves as a strength medium surrounding the materials and electrodes. Further, a medium 1214 between the HYM 1212 and the various electrode, PE and PR materials may remain as a void, or be filled with a soft solid material or a gas (e.g., air).

FIG. 12(*b*) is an electrical symbol for the PET2R 1200 of FIG. 12(*a*). Operation of the PET2R 1200 is similar to a pair of 3-terminal PET devices having a same gate electrode.

Figure 13:
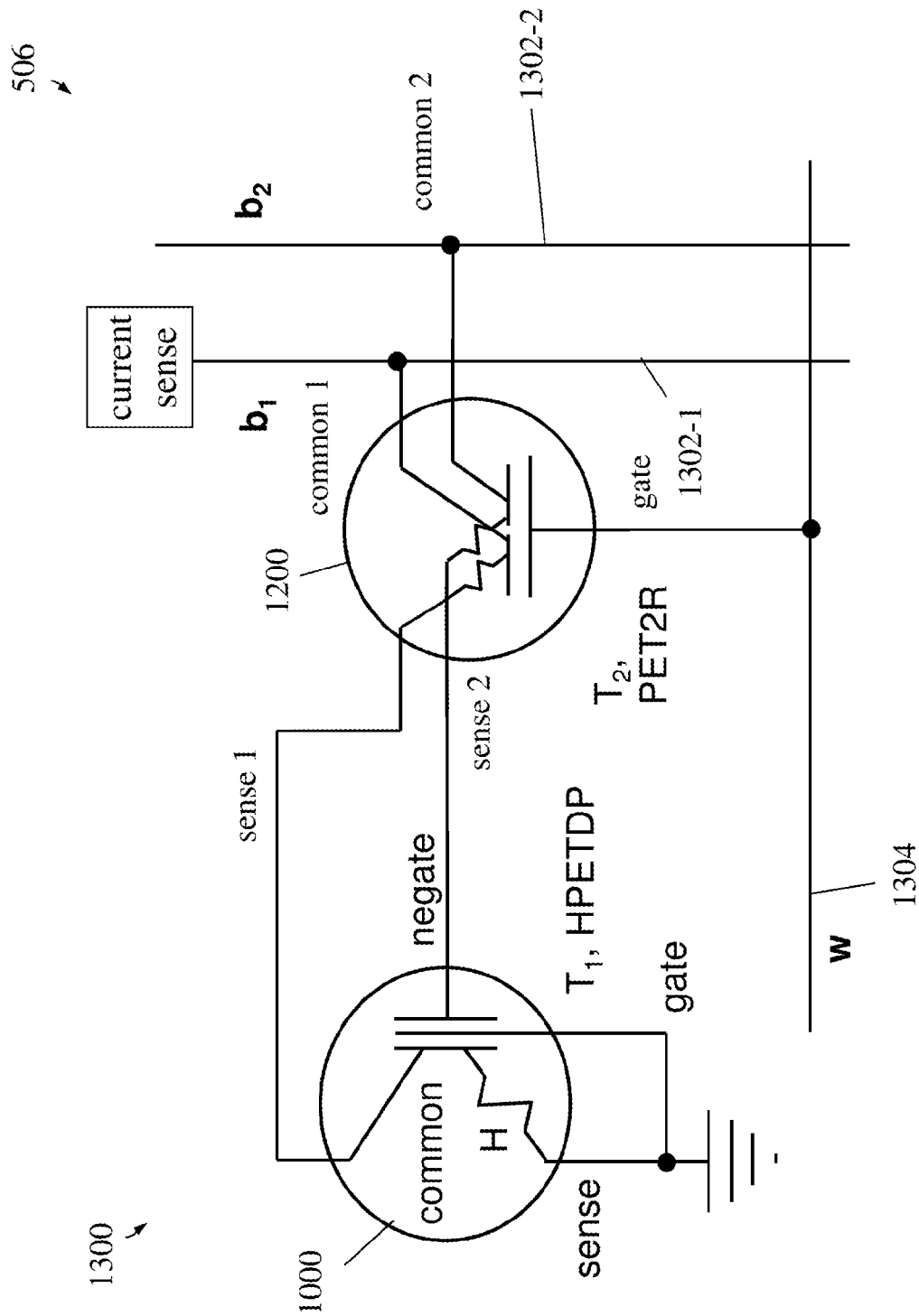
FIG. 13 is a schematic diagram of a 2-PET memory element incorporating an HPETDP storage transistor and a PET2R access transistor, in accordance with an exemplary embodiment.

Using the 4-terminal HPETDP device 1000 of FIG. 10 in combination with a 5-terminal PET2R device 1200 of FIG. 12 enables the formation of a nonvolatile, 3-terminal memory element 1300 as illustrated in FIG. 13. In this embodiment, the memory element 1300 includes a 4-terminal HPETDP device 1000 as a storage transistor coupled to a 5-terminal PET2R device 1200 serving as an access transistor. The common terminals (common 1, common 2) of the PET2R 1200 are respectively connected to a pair of bit lines ($b_1$, $b_2$) 1302-1, 1302-2, while the gate terminal of the PET2R 1200 is connected to a word line (w) 1304. The first sense terminal (sense 1) of the PET2R 1200 is connected to the common terminal of the HPETDP 1000, and the second sense terminal (sense 2) of the PET2R 1200 is connected to the negate terminal of the HPETDP 1000. The gate and sense terminals of the HPETDP 1000 are connected to ground.

Operation of the memory element 1300 is further understood with reference to the table of FIG. 14. An equilibrium state of the HPETDP 1000 is established when the common and negate terminals have 0 voltage and the HPETDP 1000 is in the stable state with a bit value of 0 or 1 (FIG. 3). To enable a write operation, the write line voltage is set to w=H so as to turn the PET2R 1200 on for zero or negative bit line voltages. To write a 0 (i.e., set a high resistance in the HPETDP 1000), the $b_2$ potential is set to $-H/2$ so that the gate-negate voltage drop across the HPETDP 1000 is H/2. In addition, the $b_1$ potential is set to 0 such that PE 1 is fixed and the PR resistance in the HPETDP 1000 increases to its high state. To write a 1 (i.e., set a low resistance in the HPETDP 1000), the $b_1$ potential is set to $-H/2$ so that the gate-common voltage drop HPETDP 1000 is H/2. In addition, the $b_2$ potential is set to zero such that the PR resistance in the HPETDP 1000 drops to the low state. The voltage at the common terminal of the in the HPETDP 1000 is independent of the state of the HPET only if the ON resistance for the PET2R 1200 is significantly less than the ON resistance in the HPETDP 1000; i.e., $R_{2on} \ll R_{1on}$, as in FIGS. 5 and 8.

For a read operation in a row, the write line voltage is set to w=H in that row and the $b_1$ potential is set to $-\in H/2$, which is not low enough to change the state of the HPETDP 100. The current is sensed through the $b_1$ line with a total voltage drop of $\in H/2$.

There is a current through both on-state PET2Rs and HPETDPs during the write. If half of the HPETDPs in a row are on, then the current equals $0.5 \cdot NH/R_{1on}$ for a memory with N columns and M rows. The non-write rows have a leakage current through their off-state PET2Rs in the amount of $0.5 \cdot N(M-1)H/R_{2off}$ considering that $R_{2off} \gg R_{1on}$. The write row dominates if $R_{2off}/R_{1on} > (M-1)$, as in the previous designs.

During the read process, leakage current enters each $b_1$ line from the rows that are not being read. These rows have resistance $R_{2off}$ in all of their PET2Rs. There is a voltage drop of $\in H/2$ across each combination of PET2R and HPETDP. If half of the HPETDPs in a no-read column are in the on state with resistance $R_{1on} \ll R_{2off}$, then the leakage current from the no-read rows in that column is $0.5 (M-1) \in H/(2R_{2off})$. This has to be smaller than the maximum current from the read row, which is $\in H/(2R_{1on})$. Avoidance of contamination of the sense line by the non-read rows therefore requires $R_{2off}/R_{1on} \gg 0.5(M-1)$, as in the previous designs.

In the absence of reading or writing, the memory element 1300 in FIG. 13 should have w=0 so all PET2Rs are off, and $b_1=b_2=0$ so the HPETDP has its equilibrium state. There is no leakage current through any of the PETs in this standby state because all voltages are zero. The state of the memory in the HPETDP remains, and therefore the memory is nonvolatile in contrast to the designs of FIGS. 5 and 8.

Power Requirements and Speed

The energy required to write a row of memory includes charging the word line and all of the attached gate capacitances for that row, as well as charging all the bit lines. To charge a gate in an HPET or PET requires an energy $0.5V^2C$ for voltage V and gate capacitance C in the PE. The capacitance in a PE having an area of $(30 \text{ nm})^2$ and a height of 30 nm equals about 0.3 femtofarads (fF) (assuming a dielectric constant of 1000). Each device has two PETs, or 0.6 fF capacitance. The energy required to charge a device is then 0.012 femtojoules (0) for V=0.2 Volts. For a 1000×1000 block of memory, each bit line is about 100 μm long, and considering a capacitance of the wire equal to 2 pF/cm, a bit line capacitance is 20 fF. The single word line wire capacitance of 20 fF is thus dominated by the 2000 gate capacitances on that word line (totaling 600 fF), but the capacitance of the write operation is dominated by that of all the bit lines, which is 20 pF. Thus, the bit line capacitance dominates the energy consumption of the memory, without much dependence on the PET devices themselves.

If the memory is addressed at a rate of 1 GHz for 64 lines in parallel, which have a total capacitance of 1.28 pF, the power required is $0.5V^2C \times 10^9$ Hz, or 25 μW for V=0.2V. This estimate focuses narrowly on the power required locally in the memory block for only 64 bits. The main point is that the power to write all of the PET devices is small compared to the power to charge the bit lines because the capacitance of each bit line exceeds the summed capacitances of the HPET and PET that are being written.

The power to write a PET memory is less than DRAM because the PET operates at a lower voltage, the PET memory is preserved for as long as the bias voltages are applied, and in the third design here, the PET memory is preserved even when all the voltages are zero. For the same wiring capacitance in DRAM, and the same energy per write, the PET power is less than the DRAM power in proportion to the refresh rate. Typically, DRAM has to refresh at a rate of about 16 or more times per second and PETs need far fewer refresh. The lower voltage of the PET memory saves additional energy because energy scales as the square of the voltage for a given capacitance.

Optimal operation of a PET occurs when the RC time is comparable to the sonic time. The sonic time in a PET with 30 nm height is about 10 ps. With the 0.3 fF capacitance given above, this corresponds to a total resistance in the wire and the PR of 30,000 Ohms.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A memory element, comprising:
    a first piezotronic transistor coupled to a second piezotronic transistor;
    the first and second piezotronic transistors each comprising a piezoelectric (PE) material and a piezoresistive (PR) material, wherein an electrical resistance of the PR material is dependent upon an applied voltage across the PE material by way of an applied pressure to the PR material by the PE material.

2. The memory element of claim 1, wherein the first piezotronic transistor comprises a storage transistor and the second piezotronic transistor comprises an access transistor.

3. The memory element of claim 2, wherein the PR material of the storage transistor is a hysteretic PR material, and the PR material of the access transistor is a non-hysteretic PR material.

4. The memory element of claim 3, wherein the storage transistor is a 3-terminal device and the access transistor is a 4-terminal device.

5. The memory element of claim 3, wherein the storage and access transistors have an on voltage, H, on the order of about 80 millivolts (mV) to about 200 mV.

6. The memory element of claim 5, wherein the hysteretic PR material of the storage transistor remains in a stable state for an applied voltage of about H/2 across the PE material of the storage transistor.

7. The memory element of claim 3, wherein:
    the storage transistor comprises a gate electrode coupled to a word line, a sense terminal electrode coupled to ground, and a common electrode coupled to the access transistor; and
    the access transistor comprises a first gate electrode coupled to the word line, a second gate electrode coupled to ground, a first sense electrode coupled to the common electrode of the storage transistor, and a second sense electrode coupled to a bit line.

8. The memory element of claim 7, wherein:
    the PE material of the storage transistor is disposed between the gate and common electrodes of the storage transistor, and the PR material of the storage transistor is disposed between the common and sense electrodes of the storage transistor; and
    the PE material of the access transistor is disposed between the first and second gate electrodes of the access transistor, the PR material of the access transistor is disposed between the first and second sense electrodes of the access transistor, and an insulator material is disposed between the second gate electrode and the first sense electrode of the access transistor.

9. The memory element of claim 3, wherein:
    the storage transistor comprises a gate electrode coupled to a control line biased between an on voltage and an off voltage, a sense terminal electrode to ground, and a common electrode coupled to the access transistor; and
    the access transistor comprises a first gate electrode coupled to a word line, a second gate electrode coupled to ground, a first sense electrode coupled to the common electrode of the storage transistor, and a second sense electrode coupled to a bit line.

10. The memory element of claim 9, wherein:
    the PE material of the storage transistor is disposed between the gate and common electrodes of the storage transistor, and the PR material of the storage transistor is disposed between the common and sense electrodes of the storage transistor; and the PE material of the access transistor is disposed between the first and second gate electrodes of the access transistor, the PR material of the access transistor is disposed between the first and second sense electrodes of the access transistor, and an insulator material is disposed between the second gate electrode and the first sense electrode of the access transistor.

11. A piezotronic transistor device, comprising:
a first piezoelectric (PE) material disposed between a first electrode and a second electrode;
a second PE material disposed between the first electrode and a third electrode;
a piezoresistive (PR) material disposed between the second electrode and a fourth electrode, wherein an electrical resistance of the PR material is dependent upon an applied voltage across the first PE material by way of an applied pressure to the PR material by the first PE material; and
a semi-rigid housing surrounding the PE, PR and electrode materials, the semi-rigid housing in direct physical contact with the first, third and fourth electrodes.

12. The piezotronic transistor device of claim 11, wherein an applied voltage across the first and second electrodes causes an expansion of the first PE material and an increase in applied pressure to the PR material, thereby causing a decrease in the electrical resistance of the PR material.

13. The piezotronic transistor device of claim 12, wherein an applied voltage across the first and third electrodes causes an expansion of the second PE material and a decrease in applied pressure to the PR material, thereby causing an increase in the electrical resistance of the PR material.

14. The piezotronic transistor device of claim 13, wherein an absence of an applied voltage across the first and second electrodes, and across the first and third electrodes results in a static pressure exerted on the PR material, thereby maintaining the PR material in a bi-stable state with respect to the electrical resistance thereof.

15. The piezotronic transistor device of claim 14, wherein the second PE material is adjacent the first PE material.

16. The piezotronic transistor device of claim 14, wherein the second PE material surrounds the first PE material.

17. A piezotronic transistor device, comprising:
a piezoelectric (PE) material disposed between a first electrode and a second electrode, the PE material also disposed between the first electrode and a third electrode;
a first piezoresistive (PR) material disposed between the second electrode and a fourth electrode, wherein an electrical resistance of the first PR material is dependent upon an applied voltage, via the first and second electrodes, across the first PE material by way of an applied pressure to the first PR material by the PE material;
a second piezoresistive (PR) material disposed between the third electrode and a fifth electrode, wherein an electrical resistance of the second PR material is dependent upon an applied voltage, via the first and third electrodes, across the PE material by way of an applied pressure to the second PR material by the PE material; and
a semi-rigid housing surrounding the PE, PR and electrode materials, the semi-rigid housing in direct physical contact with the first, fourth and fifth electrodes.

18. A non-volatile memory element, comprising:
a first piezotronic transistor coupled to a second piezotronic transistor;

the first and second piezotronic transistors each comprising at least one piezoelectric (PE) material and at least one piezoresistive (PR) material, wherein an electrical resistance of the at least one PR material is dependent upon an applied voltage across the at least one PE material by way of an applied pressure to the at least one PR material by the at least one PE material.

19. The non-volatile memory element of claim 18, wherein:
the first piezotronic transistor comprises a 4-terminal storage transistor having a single, hysteretic PR material and first and second PE materials; and
the second piezotronic transistor is a 5-terminal access transistor having first and second non-hysteretic PR materials, and a single PE material.

20. The non-volatile memory element of claim 19, wherein:
the storage transistor comprises a first gate electrode and a sense electrode coupled to ground, and second gate electrode and a common electrode coupled to the access transistor; and
the access transistor comprises a gate electrode coupled to a word line, a first sense electrode coupled to the common electrode of the storage transistor, a second sense electrode coupled to the second gate electrode of the storage transistor, a first common electrode coupled to a first bit line, and a second common electrode coupled to a second bit line.

21. The non-volatile memory element of claim 20, wherein:
the first PE material of the storage transistor is disposed between the first gate electrode and the common electrode of the storage transistor, the second PE material of the storage transistor is disposed between the first gate electrode and the second gate electrode of the storage transistor, and the PR material of the storage transistor is disposed between the common electrode and the sense electrode of the storage transistor; and
the PE material of the access transistor is disposed between the gate electrode and the first common electrode of the access transistor, the PE material of the access transistor is also disposed between the gate electrode and the second common electrode of the access transistor, the first PR material is disposed between the first common electrode and the first sense electrode of the access transistor, and the second PR material is disposed between the second common electrode and the second sense electrode of the access transistor.

22. The non-volatile memory element of claim 21, wherein the access transistor has an on voltage, H, on the order of about 80 millivolts (mV) to about 200 mV.

23. The non-volatile memory element of claim 22, wherein the first PE material of the storage transistor expands to place the hysteretic PR material of the storage transistor in a low resistance state at an applied voltage of about H/2 across the first gate electrode and the common electrode of the storage transistor.

24. The non-volatile memory element of claim 22, wherein the second PE material of the storage transistor expands to place the hysteretic PR material of the storage transistor in a high resistance state at an applied voltage of about H/2 across the first gate electrode and the second gate electrode of the storage transistor.

25. The non-volatile memory element of claim 24, wherein the hysteretic PR material of the storage transistor remains in a stable state in the absence of an applied voltage across the first and second PE materials of the storage transistor.

* * * * *